United States Patent
Salter et al.

(10) Patent No.: US 10,296,213 B1
(45) Date of Patent: May 21, 2019

(54) HEATABLE VEHICLE KEYPAD ASSEMBLY AND KEYPAD HEATING METHOD

(71) Applicant: Ford Global Technologies, LLC, Dearborn, MI (US)

(72) Inventors: Stuart Salter, White Lake, MI (US); Paul Kenneth Dellock, Northville, MI (US); Pietro Buttolo, Dearborn Heights, MI (US); James J. Surman, Clinton Township, MI (US); Cornel Gardner, Romulus, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/806,455

(22) Filed: Nov. 8, 2017

(51) Int. Cl.
| | |
|---|---|
| *G06F 3/0488* | (2013.01) |
| *H05K 1/02* | (2006.01) |
| *G06F 3/044* | (2006.01) |
| *H05B 3/84* | (2006.01) |
| *H05K 7/14* | (2006.01) |
| *H05K 1/18* | (2006.01) |

(52) U.S. Cl.
CPC .......... *G06F 3/04886* (2013.01); *G06F 3/044* (2013.01); *H05B 3/84* (2013.01); *H05K 1/0212* (2013.01); *H05K 1/181* (2013.01); *H05K 7/1427* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 6,349,450 B1 * | 2/2002 | Koops | E05B 17/0016 16/430 |
| 6,646,226 B1 * | 11/2003 | Reitz | G06F 3/0202 219/209 |
| 7,989,725 B2 | 8/2011 | Boddie et al. | |
| 9,327,649 B2 | 5/2016 | Habibi | |
| 9,786,410 B2 * | 10/2017 | Shimizu | G02F 1/13439 |
| 10,067,599 B2 * | 9/2018 | Colville | B05D 7/50 |
| 2001/0032833 A1 * | 10/2001 | Collins | E05B 17/0016 219/202 |
| 2001/0037936 A1 * | 11/2001 | Hsu | H01H 3/125 200/517 |
| 2006/0256519 A1 * | 11/2006 | Fox | G06F 1/1616 361/679.08 |

(Continued)

FOREIGN PATENT DOCUMENTS

| | | |
|---|---|---|
| CN | 201965581 | 9/2011 |
| CN | 204743465 | 11/2015 |

*Primary Examiner* — Koosha Sharifi-Tafreshi
(74) *Attorney, Agent, or Firm* — Carlson, Gaskey & Olds, P.C.

(57) ABSTRACT

An exemplary heatable keypad assembly includes, among other things, a touch-sensitive sensor providing a keypad, and a heating element that includes a conductive polymer-based material and is disposed adjacent the touch-sensitive sensor. An exemplary keypad heating method includes, among other things, holding a heating element having a conductive polymer-based material near a touch-sensitive sensor. The touch-sensitive sensor provides a keypad adjacent a transparent panel of a vehicle. The method further includes activating the conductive polymer-based material to heat an area of the transparent panel adjacent the keypad.

19 Claims, 3 Drawing Sheets

(56) References Cited

U.S. PATENT DOCUMENTS

| | | | |
|---|---|---|---|
| 2008/0202912 A1* | 8/2008 | Boddie | H03K 17/962 200/600 |
| 2009/0195512 A1* | 8/2009 | Pettersson | G06F 3/016 345/173 |
| 2011/0062146 A1* | 3/2011 | Kuriki | H05B 3/84 219/553 |
| 2012/0133494 A1* | 5/2012 | Cruz-Hernandez | G06F 3/016 340/407.2 |
| 2013/0075383 A1 | 3/2013 | Kim | |
| 2013/0186875 A1 | 7/2013 | Lisinski et al. | |
| 2014/0288225 A1* | 9/2014 | Shipley | C08L 23/16 524/451 |
| 2016/0236612 A1 | 8/2016 | Caron | |
| 2017/0293386 A1* | 10/2017 | Seder | G02F 1/132 |

\* cited by examiner

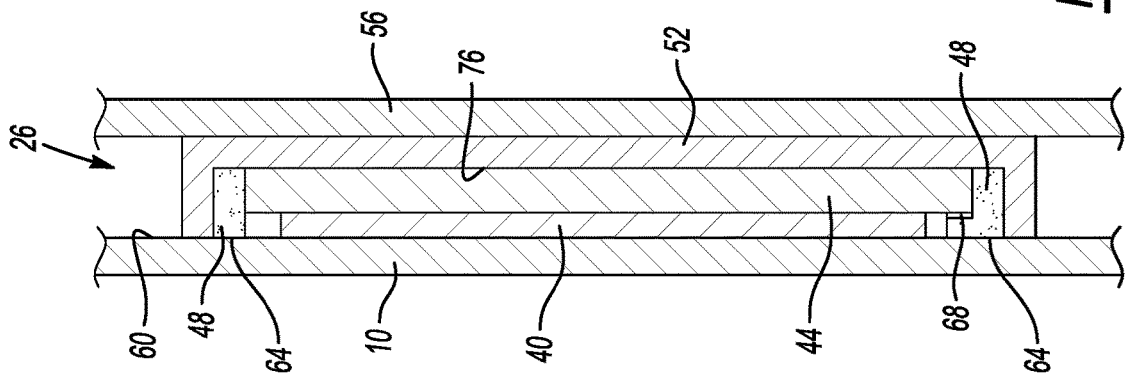
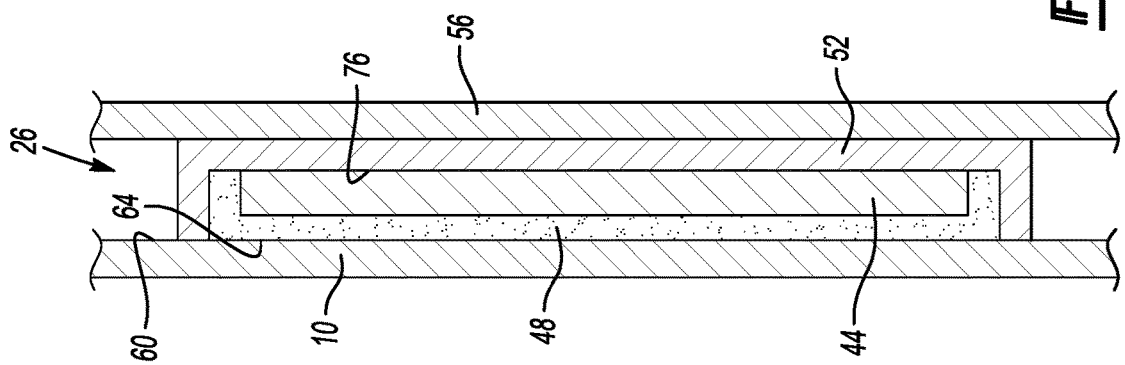
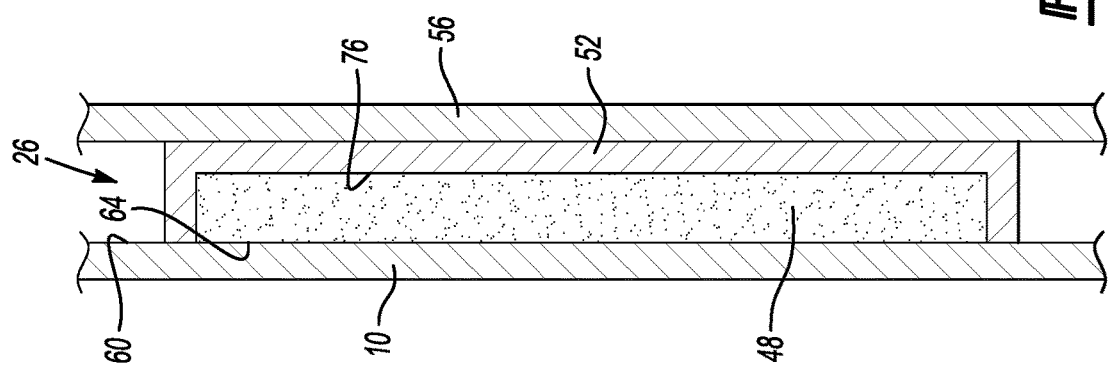

HEATABLE VEHICLE KEYPAD ASSEMBLY AND KEYPAD HEATING METHOD

TECHNICAL FIELD

This disclosure relates generally to a keypad of a vehicle and, more particularly, to heating areas associated with the keypad.

BACKGROUND

Many vehicles incorporate keypads. Some keypads include a touch-sensitive keypad accessible from an exterior of the vehicle. The keypads can be near, for example, a B-pillar or a window of the vehicle.

Doors of the vehicle can lock or unlock in response to a user inputting an appropriate code into the keypad. Other functions of the vehicle can also be controlled through the keypad, such as, for example, locking or unlocking a trunk compartment. The keypad can permit control of such functions from outside the vehicle, and without requiring the user to manipulate a physical latch on the door or to interface directly with a key fob.

The keypads can be disposed adjacent a transparent panel of the vehicle, such as adjacent a rear side window panel of the vehicle. A build-up of contaminants, such as ice, snow, etc., can interfere with a user viewing and interacting with the keypad.

SUMMARY

A heatable keypad assembly according to an exemplary aspect of the present disclosure includes, among other things, a touch-sensitive sensor providing a keypad, and a heating element that includes a conductive polymer-based material and is disposed adjacent the touch-sensitive sensor.

In a further non-limiting embodiment of the foregoing assembly, the touch-sensitive sensor and the heating element interface directly with a transparent panel of a vehicle.

In a further non-limiting embodiment of any of the foregoing assemblies, the transparent panel is a window.

In a further non-limiting embodiment of any of the foregoing assemblies, the touch-sensitive sensor and the heating element directly contact a surface of the window that faces a passenger compartment of a vehicle.

In a further non-limiting embodiment of any of the foregoing assemblies, the touch-sensitive sensor is a capacitive sensor.

In a further non-limiting embodiment of any of the foregoing assemblies, the assembly includes a printed circuit board. The touch-sensitive sensor is sandwiched between the printed circuit board and the transparent panel.

In a further non-limiting embodiment of any of the foregoing assemblies, the conductive polymer-based material includes a carbon filler and an extra high molecular weight high-density polyethylene resin base In a further non-limiting embodiment of any of the foregoing assemblies, the conductive polymer-based material further includes a maleic anhydride grafted polypropylene compatibilizer.

A further non-limiting embodiment of any of the foregoing assemblies includes a housing. The touch-sensitive sensor and the conductive polymer-based material are at least partially disposed within a cavity of the housing.

In a further non-limiting embodiment of any of the foregoing assemblies, the housing is a polymer or polymer-based material that is less electrically conductive than the conductive polymer-based material. Also, the heating element is an in-molded component that is in-molded within a cavity provided by the housing.

A keypad heating method according to another exemplary aspect of the present disclosure includes, among other things, holding a heating element having a conductive polymer-based material near a touch-sensitive sensor. The touch-sensitive sensor provides a keypad adjacent a transparent panel of a vehicle. The method further includes activating the conductive polymer-based material to heat an area of the transparent panel adjacent the keypad.

In a further non-limiting embodiment of the foregoing method, the transparent panel is a vehicle window.

A further non-limiting embodiment of any of the foregoing methods includes directly contacting a surface of the transparent panel that faces a passenger compartment of the vehicle with both the capacitive sensor and the conductive polymer-based material.

A further non-limiting embodiment of any of the foregoing methods includes flexing the conductive polymer-based material when holding the conductive polymer-based material against the transparent panel.

In a further non-limiting embodiment of any of the foregoing methods, the touch-sensitive sensor is a capacitive sensor.

In a further non-limiting embodiment of any of the foregoing methods, the conductive polymer-based material includes a carbon filler.

A further non-limiting embodiment of any of the foregoing methods includes sandwiching the touch-sensitive sensor and the heating element between a housing and the transparent panel during the holding.

A further non-limiting embodiment of any of the foregoing methods includes in-molding the heating element within a cavity of the housing.

A further non-limiting embodiment of any of the foregoing methods includes holding a printed circuit board within a cavity of the housing using the heating element.

In a further non-limiting embodiment of any of the foregoing methods, the housing is a polymer or polymer-based material that is less electrically conductive than the conductive polymer-based material.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows:

FIG. 4 illustrates a section view taken at line 4-4 in FIG. 3.

FIG. 5 illustrates a section view taken at line 5-5 in FIG. 3.

FIG. 6 illustrates a section view taken at line 6-6 in FIG. 3.

DETAILED DESCRIPTION

This disclosure relates generally to a keypad assembly for a vehicle. In particular, the keypad is a heatable keypad assembly.

Thermal energy is generated by activating a conductive polymer-based material within the heatable keypad assembly. The thermal energy can inhibit ice, snow, etc. from accumulating on areas of a vehicle associated with the keypad. Buildup of such contaminants could interfere with a user viewing and interacting with the keypad.

Figure 1:
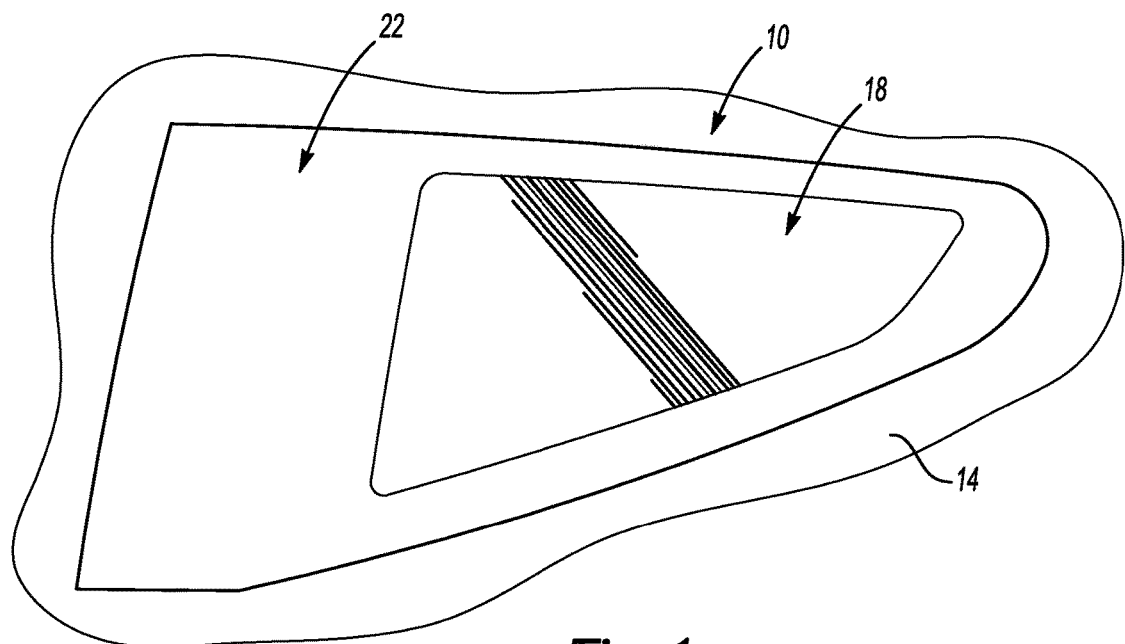
FIG. 1 illustrates a rear side window panel area of a vehicle.

FIG. 1 shows a driver side rear side window 10 of an exemplary vehicle 14. The window 10 includes a relatively transparent region 18 and a relatively opaque region 22. The opaque region 22 can be established by applying a coating, such as a blackout coating, to an inwardly facing surface of the window 10.

Figure 2:
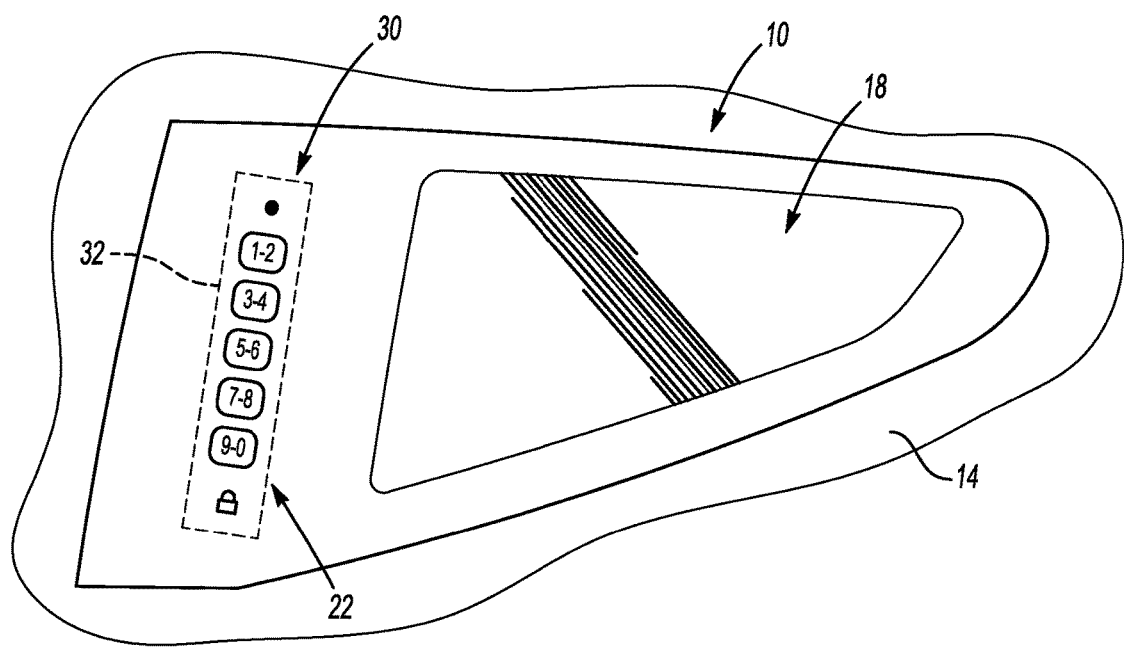
FIG. 2 illustrates a keypad having a plurality of virtual buttons illuminated on the rear side window panel.
Figure 3:
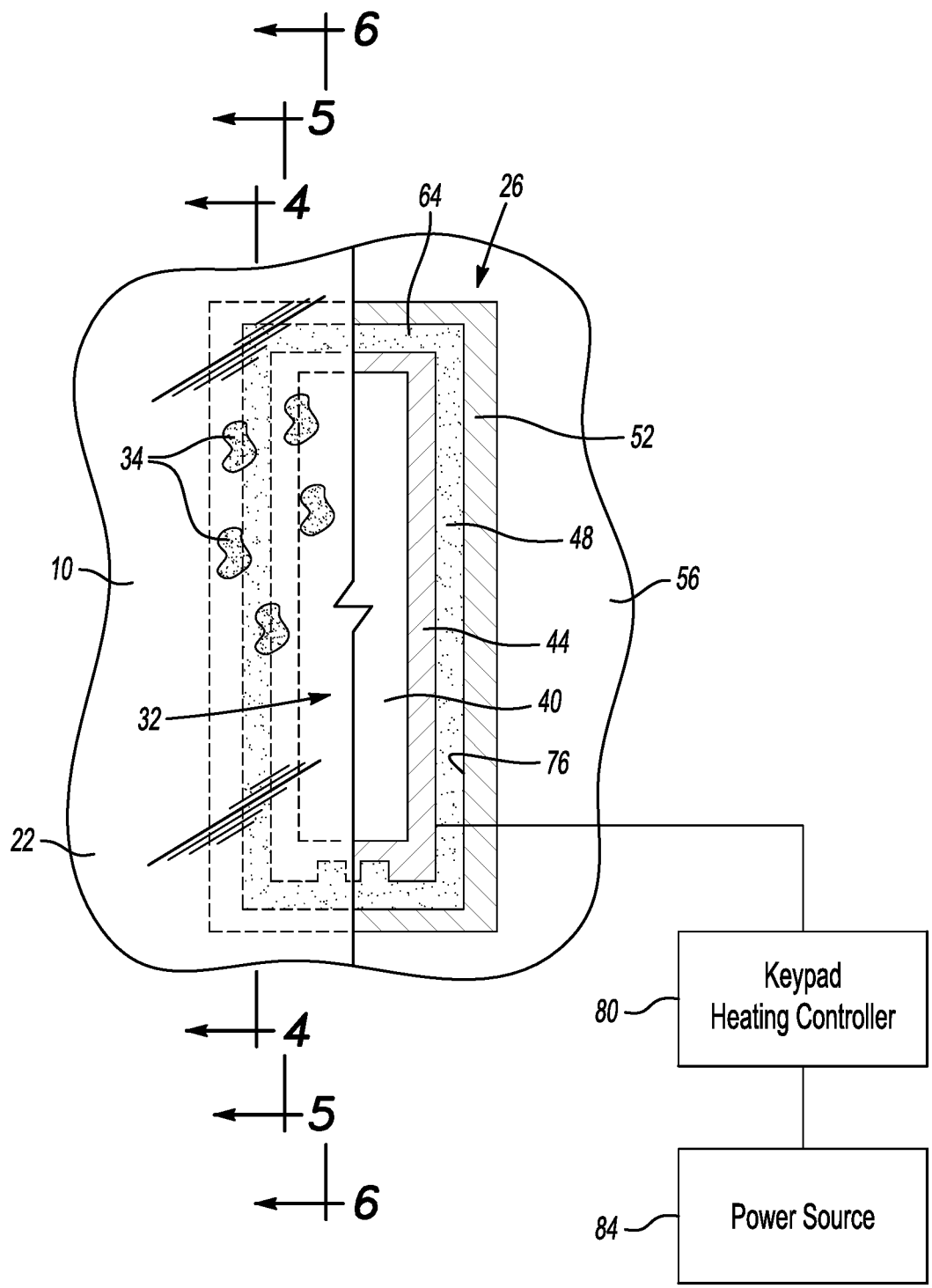
FIG. 3 illustrates a close-up view of a portion of the rear side window panel of FIGS. 1 and 2 with selected portions cut away to show a heatable keypad assembly.

Referring now to FIGS. 2 and 3, a heatable keypad assembly 26 is disposed along an interior side of the window 10 within the opaque region 22. The keypad assembly 26 can selectively illuminate a plurality of virtual buttons 30 through the opaque region 22. The virtual buttons 30, can be illuminated in response to a user contacting the window 10 in an area near the keypad assembly 26. The virtual buttons 30, when illuminated, are visible from outside the vehicle 14.

The plurality of virtual buttons 30 are in a designated region 32 of the window 10. Respective areas of the designated region 32 corresponding to the virtual buttons 30 are substantially touch-sensitive. That is, one of the virtual buttons 30 of the keypad assembly 26 can be activated by a user touching an area of the designated region 32 corresponding to that one of the virtual buttons 30.

In this exemplary embodiment, the heatable keypad assembly 26 includes a touch-sensitive sensor comprising a capacitive sensor. The capacitive sensor can be utilized to sense a user's fingers contacting the window 10 in the areas corresponding to the virtual buttons 30.

In another exemplary embodiment, the heatable keypad assembly could include a touch-sensitive sensor comprising optical switches. The optical switches emit light through respective areas of the designated region corresponding to the virtual buttons 30. A user's contact with the areas corresponding to the virtual buttons 30 can then be detected by a sensor that detects light reflected back by the user's finger toward the keypad assembly.

The designated region 32 having the virtual buttons 30 is exposed to an environment outside the vehicle 14. Contaminants 34 such as ice, snow, frost, etc. can build up on the window 10 in the designated region 32. The buildup of the contaminants 34 can interfere with a user's ability to view the virtual buttons 30, as well as a user's ability to interact with the virtual buttons 30. For example, a layer of ice on the window 10 may prevent a capacitive sensor within the keypad assembly 26 from detecting a user's fingers.

The exemplary keypad assembly 26 can selectively generate thermal energy. The thermal energy can heat the designated region 32 of the window 10 and portions of the keypad assembly 26. Heating the designated region 32 can, among other things, inhibit the contaminants 34 from building up within the designated region. The heating, for example, melts the contaminants 34. Inhibiting a build-up of contaminants 34 can reduce the likelihood for the contaminants 34 interfering with the user's viewing virtual buttons 30 or interacting with the virtual buttons 30.

Referring now to FIGS. 4 to 6 with continuing reference to FIG. 3, the keypad assembly 26, in an exemplary embodiment, includes a capacitive sensor 40, a printed circuit board 44, a heating element 48, and a housing 52. The keypad assembly 26 can be sandwiched between the window 10 and an area of sheet metal 56 such that the keypad assembly 26 is pressed against a surface 60 of the window 10 that faces a passenger compartment.

The capacitive sensor 40 is, in this example, a capacitive flex circuit that is adhesively secured to the surface 60. The capacitive sensor 40 is pressed against the surface 60 when in the installed position. The capacitive sensor 40 is operably coupled to the printed circuit board 44 via a, for example, zero insertion force socket. A user's fingers tapping the window 10 can be detected via data passed from the capacitive sensor 40 to the printed circuit board 44.

In some examples, the capacitive sensor 40 can be adhesively secured to the surface 60 of the window 10 via a peel-and-stick adhesive, such as adhesive tape sold under the 3M® 468MP tradename.

The heating element 48, in this exemplary embodiment, extends about a periphery of the printed circuit board 44 and, in at least areas 64, directly contacts the surface 60 of the window 10.

The heating element 48 comprises a material that is conductive and polymer-based. The material is relatively flexible, which can facilitate good contact with the surface 60 as the heating element 48 is pressed against the surface 60.

In an exemplary embodiment, the material comprises a carbon filler within an extra high molecular weight high-density polyethylene resin base. Exemplary carbon fillers could include carbon black, graphite, and synthetic exfoliated graphite. The polyethylene resin can be, for example, an ethylene-hexene copolymer, such as ethylene-hexene copolymers sold under the MARLEX® HXM 50100 tradename. Such a material has a molecular weight higher than conventional high-density polyethylenes, which can result in improved ductility and strength over conventional high-density polyethylenes.

The extra high molecular weight high-density polyethylene resin base can be relatively rigid when compared to conventional high-density polyethylenes and have, for example, a flex modulus of 1,200 MPa. The extra high molecular weight high-density polyethylene resin base can have a relatively low brittleness temperature when compared to conventional high-density polyethylenes. The brittleness temperature can be, for example, less than or equal to 75° C. Rigidness and low brittleness temperatures can provide relatively high impact strength at low temperatures versus conventional high-density polyethylenes. The extra high molecular weight high-density polyethylene resin base can provide relatively robust tensile impact with an acceptable Vicat softening temperature and heat deflection temperatures, as well as high elongations at brakes of greater than 700%.

In some examples, thermal conductivity for the extra high molecular weight high-density polyethylene resin base is relatively low (about 0.25 w/m.K) and the volume resistivity is relatively low (about $10^{16}$ ohm.cm). The carbon filler increases thermal and electrical conductivity for the material.

The specific composition of the filler of the material can be adjusted depending on desired material properties. In one specific example, the material includes a filler that comprises a blend of 8% (by weight) TIMEX® C-THERM TM011 Graphite, 10% natural graphite, and 7% ENSACO 350 g Conductive Carbon Black. Such a filler can enhance ductility of the material at relatively low cost.

In some exemplary embodiments, an additive of 1-3% maleic anhydride grafted polypropylene compatibilizers is added to the material. This additive has, in some exemplary embodiments, been found to improve bonding of the base to the filler, which can further enhance impact strength and ductility.

The material can, in some examples, have a thermal conductivity of about 2.5 Watts/m.K and a volume resistivity of about $10^2$ Ohm.cm, an elongation at break of about 25%, a flexural strength of about 300 MPa and a flexural modulus of about 1.4 Gpa. Also, the material can have a heat deflection temperature of about 95° C., which is above the typical operating temperature of the material and the Vicat softening temperature of the material.

The specific mix of the base, filler, and, if required, additive can be adjusted to influence thermal conduction and electrical conduction of the material.

In the exemplary keypad assembly 26, the heating element 48 can operably couple to the printed circuit board at area 68. In some examples, a gold contact pad, or a contact pad of another material, can be incorporated on the printed circuit board 44 in the area 68 to facilitate electrical conductivity between the printed circuit board 44 and the heating element 48.

In another example, an interconnector can be used in the area 68 to electrically couple the heating element 48 to the printed circuit board 44. An example interconnector can include interconnectors manufactured by SHIN-ETSU®.

In the exemplary keypad assembly 26, the capacitive sensor 40, the printed circuit board 44, and the heating element 48 are disposed within a cavity 76 of the housing 52. The housing 52, together with the window 10, substantially enclose the capacitive sensor 40, the printed circuit board 44, and the heating element 48 within the cavity 76.

Sandwiching the keypad assembly 26 against the surface 60 of the window 10 can slightly deform or flex at least the heating element 48. Again, such slight deformation can ensure good contact between the heating element 48 and the surface 60 of the window 10, as well as facilitating coupling of the heating element 48 to the printed circuit board 44.

The housing 52 can be a polymer or polymer-based material. Relative to the conductive polymer-based material of the heating element 48, the housing 52 is substantially non-conductive.

The printed circuit board 44 is operably coupled to a keypad heating controller 80 of the vehicle 14 (FIG. 1) via electrical leads, for example. The keypad heating controller 80 can be a stand alone controller or incorporated as a portion of another controller within the vehicle 14.

The keypad heating controller 80 can include a programmable memory portion and a processor portion. The processor portion can be configured to execute a program stored in the memory portion. Exemplary programs can activate the printed circuit board 44 to cause the printed circuit board 44 to communicate electrical current from a power source 84 through the heating element 48 in response to various inputs. The keypad heating controller 80 can be programmed to, for example, cause the printed circuit board 44 to activate the heating element 48 in response to an external temperature around the vehicle 14 falling below a threshold temperature, such as a threshold temperature below which contaminants 34 are likely to form on the window 10.

Conducting electrical current through the heating element 48 generates thermal energy. As the heating element 48 is pressed against the interior surface 60 of the window 10, thermal energy from the heating element 48, when activated, can heat the designated region 32 of the window 10. The heating element 48 can also heat the printed circuit board 44 and the capacitive sensor 40. Thermal energy from these components can then pass to other areas within the designated region 32.

Heating the designated region 32 can raise a temperature of the window 10 within the designated region to inhibit contaminants 34 from accumulating within the designated region 32. Raising the temperature of the designated region 32 can, for example, melt ice from the designated region 32.

In similar exemplary embodiments, the heating element 48 is in-molded within the cavity 76 of the housing 52. For example, the housing 52 could be formed and then positioned within a mold cavity to provide a desired profile of the heating element 48.

Material can then be injected into the mold cavity against housing 52. The material cures to form the heating element 48 within the cavity 76 of the housing 52.

In some examples, the printed circuit board 44 is positioned within the cavity 76 prior to molding the heating element 48. After molding the heating element 48, the printed circuit board 44 is held within the cavity 76 by the heating element 48.

A person having skill in this art and the benefit of this disclosure could understand how to structurally differentiate a heating element in-molded within the cavity 76 from a heating element that is not in-molded.

Features of the disclosed examples include a heating element of a keypad assembly that can be used to defrost and otherwise melt snow and ice from an area of a window near the keypad assembly. The keypad assembly can be manufactured in some examples utilizing an in-molding approach, which can save manufacturing costs.

The heating element can be a relatively flexible conductive polymer-based material. The flexibility facilitates deformation of the heating element as the heating element is pressed against an interior facing surface of the window. The deformation can ensure good contact between the heating element and the window, which can facilitate thermal conductivity from the heating element to the window.

The deformation can also ensure robust electrical contact between the heating element and, for example, a printed circuit board, which can eliminate more complicated and costly mechanisms for connecting a heating element to a printed circuit board.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:
1. A heatable keypad assembly, comprising:
a touch-sensitive sensor providing a keypad; and
a heating element that includes a conductive polymer-based material and is disposed adjacent the touch-sensitive sensor, wherein the touch-sensitive sensor and the heating element interface directly with a transparent panel of a vehicle.
2. The heatable keypad assembly of claim 1, wherein the transparent panel is a window.

3. The heatable keypad assembly of claim 2, wherein the touch-sensitive sensor and the heating element directly contact a surface of the window that faces a passenger compartment of a vehicle.

4. The heatable keypad assembly of claim 3, wherein the touch-sensitive sensor is a capacitive sensor.

5. The heatable keypad assembly of claim 1, further comprising a printed circuit board operably coupled to a keypad heating controller, the touch-sensitive sensor sandwiched between the printed circuit board and the transparent panel.

6. A heatable keypad assembly, comprising:
a touch-sensitive sensor providing a keypad; and
a heating element that includes a conductive polymer-based material and is disposed adjacent the touch-sensitive sensor, wherein the conductive polymer-based material comprises a carbon filler and an extra high molecular weight high-density polyethylene resin base.

7. The heatable keypad assembly of claim 6, wherein the conductive polymer-based material further comprises a maleic anhydride grafted polypropylene compatibilizer.

8. The heatable keypad assembly of claim 1, further comprising a housing, wherein the touch-sensitive sensor and the conductive polymer-based material are each at least partially disposed within a cavity of the housing.

9. The heatable keypad assembly of claim 8, wherein the housing is a polymer or polymer-based material that is less electrically conductive than the conductive polymer-based material, wherein the heating element is an in-molded component that is in-molded within a cavity provided by the housing.

10. A keypad heating method, comprising:
holding a heating element having conductive polymer-based material near a touch-sensitive sensor, the touch-sensitive sensor providing a keypad adjacent a transparent panel of a vehicle; and
activating the conductive polymer-based material to heat an area of the transparent panel adjacent the keypad.

11. The keypad heating method of claim 10, wherein the transparent panel is a vehicle window.

12. The keypad heating method of claim 10, further comprising directly contacting a surface of the transparent panel that faces a passenger compartment of the vehicle with both the touch-sensitive sensor and the conductive polymer-based material.

13. The keypad heating method of claim 10, further comprising flexing the conductive polymer-based material when holding the conductive polymer-based material against the transparent panel.

14. The keypad heating method of claim 10, wherein the conductive polymer-based material comprises a carbon filler and an extra high molecular weight high-density polyethylene resin base.

15. The keypad heating method of claim 10, further comprising sandwiching the touch-sensitive sensor and the heating element between a housing and the transparent panel during the holding, and holding the heating element within a cavity of housing during the sandwiching.

16. The keypad heating method of claim 15, further comprising in-molding the heating element within a cavity of the housing.

17. The keypad heating method of claim 15, further comprising holding a printed circuit board within a cavity of the housing using the heating element, the printed circuit board operably coupled to a keypad heating controller.

18. The keypad heating method of claim 15, wherein the housing is a polymer or polymer-based material that is less electrically conductive than the conductive polymer-based material.

19. The keypad heating method of claim 10, wherein the heating element is held within a housing during the holding.

* * * * *